United States Patent
Wortman et al.

(10) Patent No.: US 6,590,784 B2
(45) Date of Patent: Jul. 8, 2003

(54) SNAP-ON-EMI-SHIELD-RETENTION SYSTEM FOR USE WITH ELECTRONIC DEVICES

(75) Inventors: Michael Leslie Wortman, Sacramento, CA (US); Stephan Karl Barsun, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/053,419

(22) Filed: Nov. 2, 2001

(65) Prior Publication Data

US 2003/0086249 A1 May 8, 2003

(51) Int. Cl.[7] .................................................. H05K 9/00
(52) U.S. Cl. ...................... 361/816; 361/818; 361/740; 361/732; 361/726; 174/51 R; 174/35
(58) Field of Search ................................. 361/818, 816, 361/800, 801, 759, 740, 732, 736, 726, 747; 174/35, 51 R; 220/324, 326

(56) References Cited

U.S. PATENT DOCUMENTS

| | | | | |
|---|---|---|---|---|
| 4,212,415 A | * | 7/1980 | Neely | 222/231 |
| 5,349,132 A | * | 9/1994 | Miller et al. | 174/35 R |
| 5,547,272 A | * | 8/1996 | Paterson et al. | 312/223.2 |
| 5,699,601 A | * | 12/1997 | Gilliam et al. | 29/278 |
| 6,111,760 A | * | 8/2000 | Nixon | 361/814 |

\* cited by examiner

Primary Examiner—David Martin
Assistant Examiner—Hung Bui

(57) ABSTRACT

A combination of EMI-shield-retention features molded onto a bezel for an equipment enclosure. The features collectively fasten a notched and cutout EMI shield to the inner surface of the bezel without requiring any tools or fasteners. Several −Z-retention features provide surfaces for the EMI shield to lie flat against the inner surface of the bezel, while several X, Y-retention features protrude through holes and notches cut in the EMI shield to further retain the EMI shield. Finally, +Z-retention features along one edge of the bezel provide flanges for the EMI shield to slide under, while +Z-retention features, on the opposite edge of the bezel from the flanges, snap over top of the EMI shield.

8 Claims, 3 Drawing Sheets

SNAP-ON-EMI-SHIELD-RETENTION SYSTEM FOR USE WITH ELECTRONIC DEVICES

TECHNICAL FIELD

The present invention relates to bezels and electromagnetic interference ("EMI") shields for electronic devices, and, in particular, to a combination of features, molded onto a bezel of an equipment enclosure, that fasten the EMI shield to the bezel.

BACKGROUND OF THE INVENTION

Typically, electronic devices are housed in standardized equipment enclosures. Many equipment enclosures include an outer housing that is supported by an inner rack. The inner rack commonly comprises a substantially rectilinear metal frame including several vertical columns, each provided with a plurality of mounting and alignment holes that permit the mounting of various components to the inner rack.

Many equipment enclosures also include a removable bezel that forms an aesthetic front face for the enclosure. The bezel may also shield internal components from environmental contaminants, such as moisture and dust, as well as shield the environment from noise generated by components within the enclosure. Removing the bezel provides access to components mounted within the enclosures in order to repair, replace, inspect, and perform maintenance tasks on the components.

Many electronic components generate electromagnetic radiation in the radio frequency ("RF") portion of the electromagnetic spectrum. RF-radiation generated by electronics is a common source of environmental electromagnetic interference ("EMI") that may degrade or impair operation of other electronic devices and circuits exposed to the RF-radiation. Increased use of electronic devices, especially mobile electronic devices such as cellular phones, has increased environmental EMI levels. Consequently, EMI shields have been incorporated into equipment enclosures to block EMI from interfering with components within equipment enclosures as well as to shield the environment from EMI generated by components within the enclosure.

Currently, many EMI shields are semi-permanently) attached to bezels using fasteners and expensive and time-consuming post-mold heat-staking steps during the manufacturing process. In addition to EMI-shield attachment being slow and expensive. EMI-shield removal is tedious, and the risk of damage to the bezel is high. Recycling of EMI shield/bezel combinations requires the plastic bezel to be separated from the EMI shield, and is therefore expensive and time-intensive because of the semi-permanent post-mold heat-stake attachments. Attachment of EMI shields by semi-permanent, post-mold heat-staking steps also fails to provide an option for consumers to purchase a bezel assembly without a pre-installed EMI shield. Consumers purchasing electronic devices in a configuration not requiring an EMI shield must still purchase an equipment enclosure pre-assembled with an EMI shield to ensure adequate shielding for future upgrades.

Thus, manufacturers, designers, and consumers of electronic devices have recognized the need for an EMI-shield-retention mechanism that allows for simple, easily detachable attachment of an EMI shield to a bezel.

SUMMARY OF THE INVENTION

One embodiment of the present invention relates to a combination of EMI-shield-retention features, molded onto the inside surface of a bezel of an equipment enclosure. The EMI-shield-retention features collectively snap onto an EMI shield containing receiving apertures complementary to the EMI-shield-retention features. The EMI shield is secured to the interior of the bezel, with movement of the EMI shield restricted in six directions: +X, −X, +Y, −Y, −Z and −Z. Movement of the EMI shield is restricted in the four directions of the X and Y axes by three X, Y-retention features, protruding through two holes and one notch cut in the EMI shield. The horizontal louvers of the bezel, along with five additional −Z-retention features, restrict movement of the EMI shield in the −Z direction. Finally, movement of the EMI shield is restricted in the +Z direction by sliding the EMI shield underneath two flanged +Z-retention features on the left edge of the bezel, while two snap-like +Z-retention features on the right edge of the bezel snap over the top surface of the EMI shield.

DETAILED DESCRIPTION OF THE INVENTION

Figure 1A:
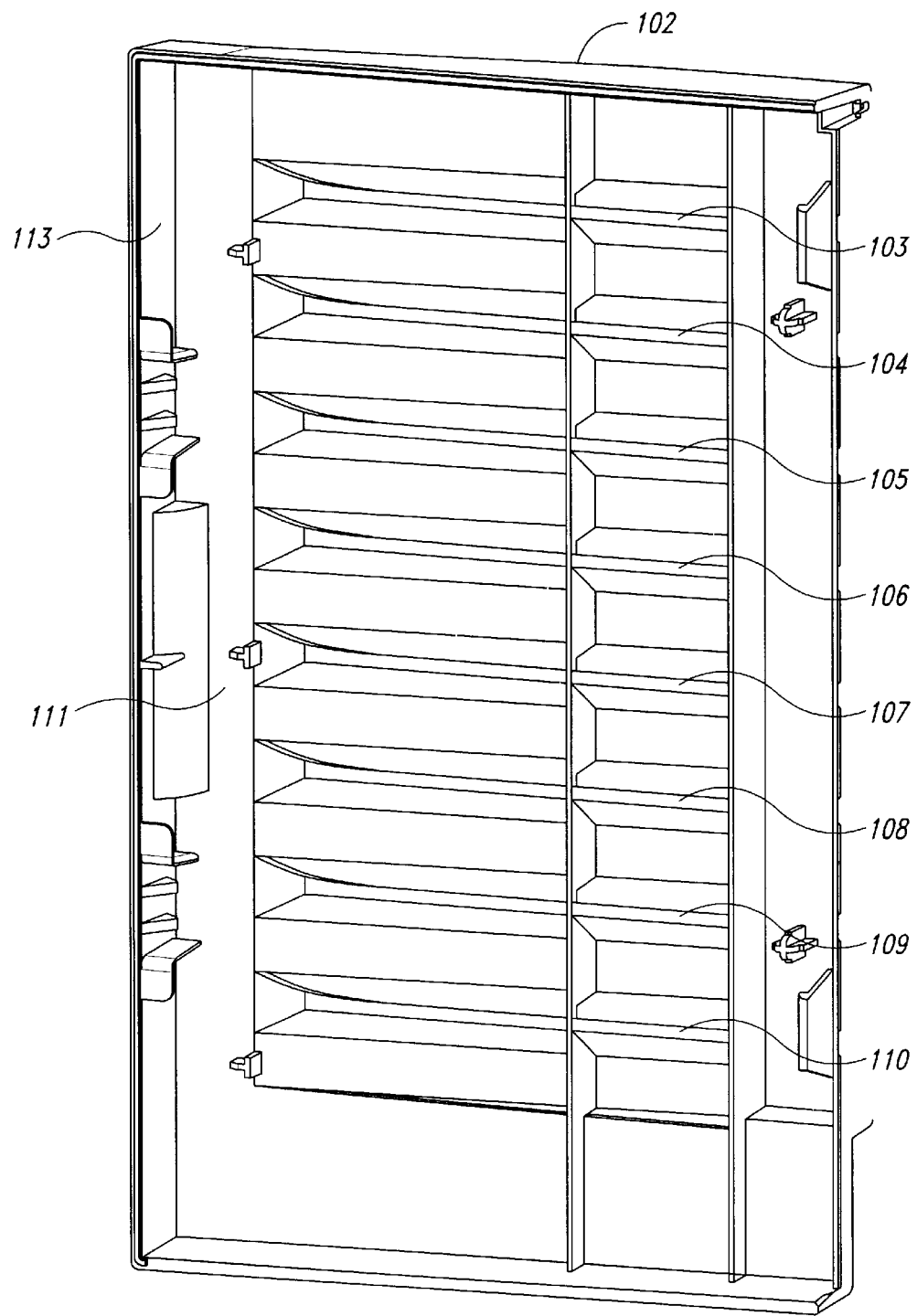
FIG. 1A is a perspective view of the inner surface of a bezel.
Figure 1B:
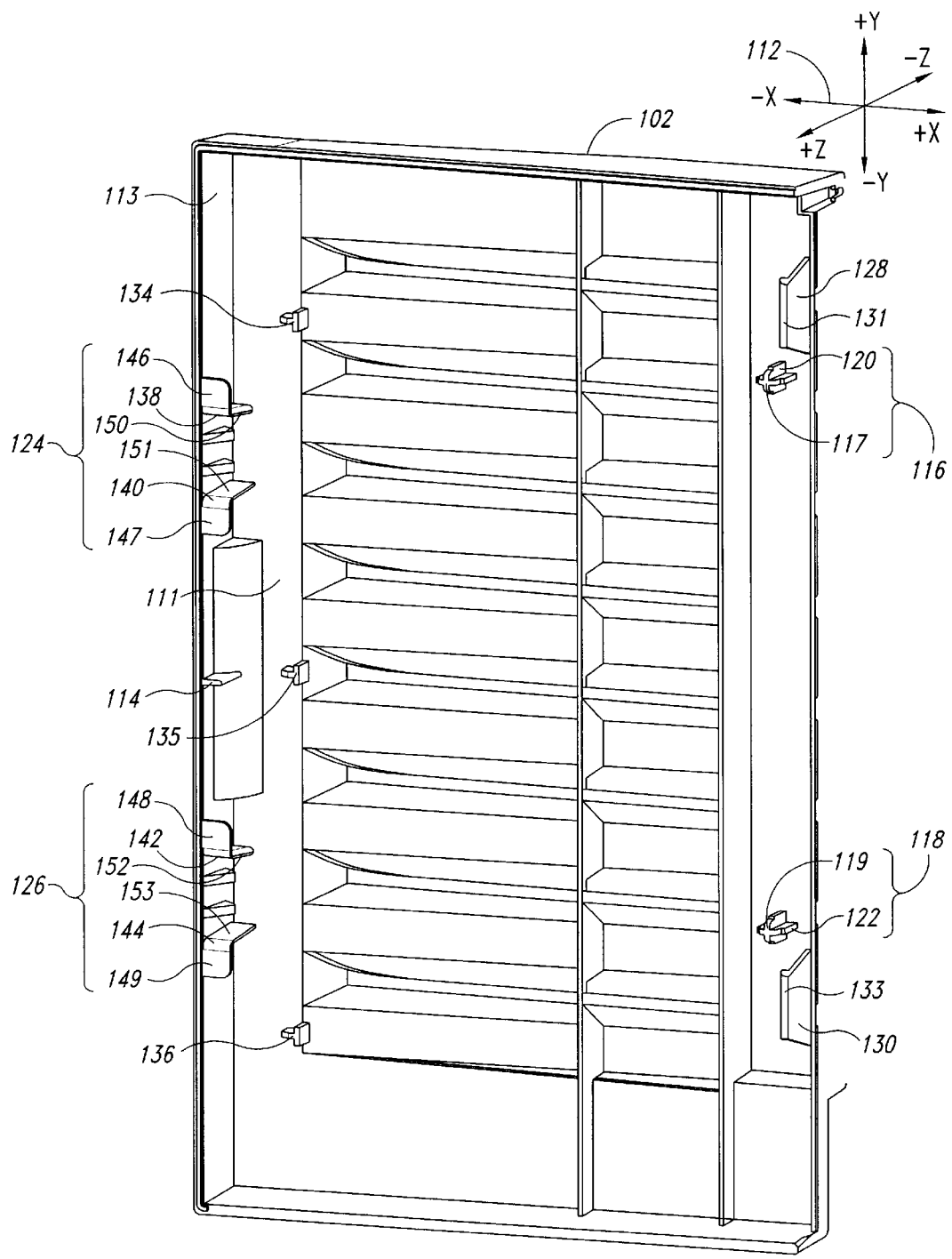
FIG. 1B is a perspective view of a bezel illustrating a combination of EMI-shield-retention features.
Figure 1C:
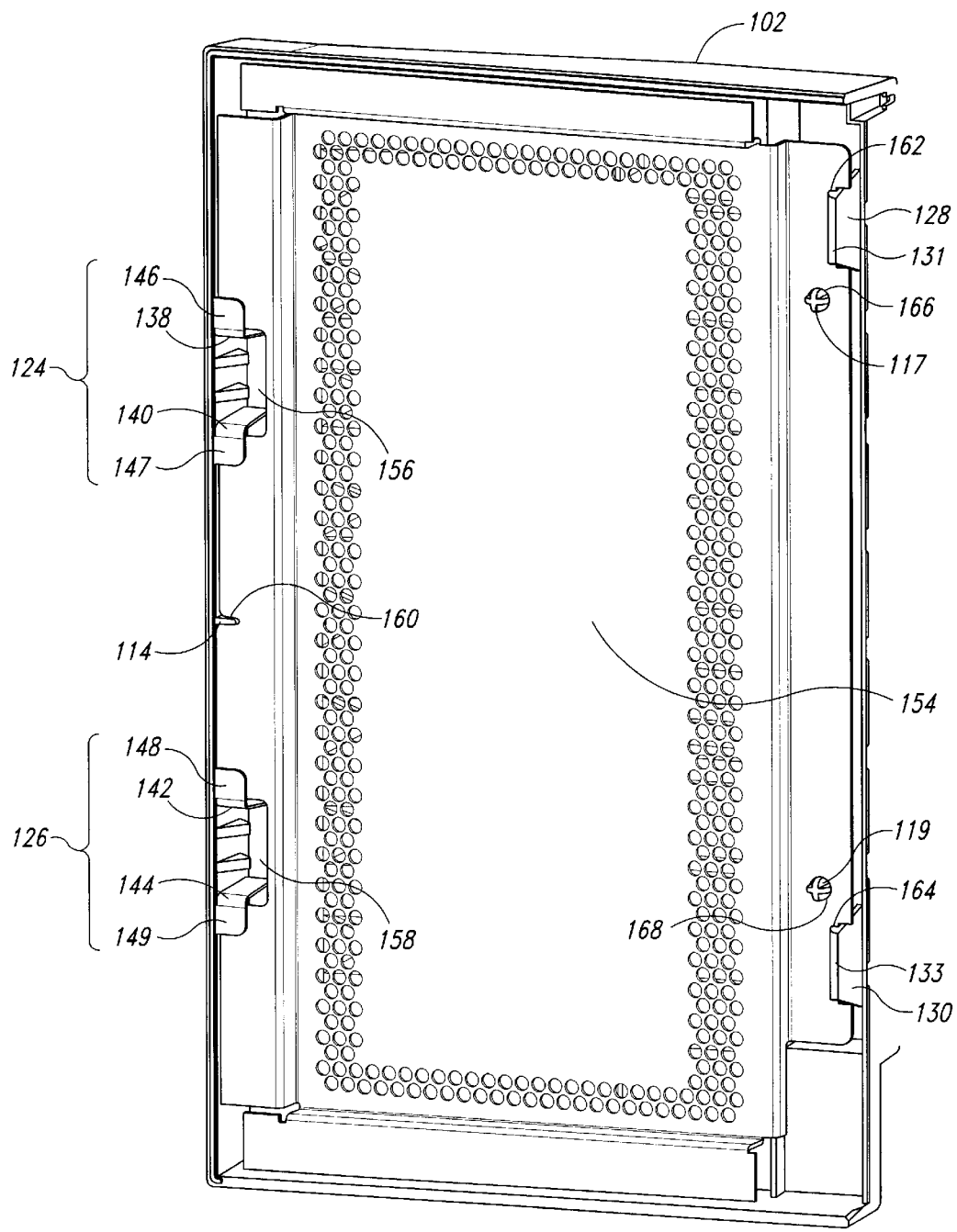
FIG. 1C is a perspective view of an EMI shield fastened to the inner surface of a bezel.

The present invention comprises a combination of features, molded onto a bezel, and used to fasten an EMI shield to the bezel of an equipment enclosure. The EMI-shield-retention features are designed to allow an EMI shield to be snapped in and out of place along the inner surface of the bezel. One embodiment of the present invention is shown in FIGS. 1A–C. FIGS. 1A–C are perspective views of the inner surface of a bezel. FIG. 1A shows the bezel 102 containing horizontal louvers 103–110 spaced along the major inner surface 111 of the bezel 102. FIG. 1B is a perspective view of the bezel illustrating the combination of EMI-shield-retention features molded onto the bezel. FIG. 1B also shows a legend 112 defining the orthogonal 3-dimensional coordinate system used to describe the invention, including 3 axes: X, Y and Z. Each axis has two directions, a plus ("+") direction, and a minus ("−") direction. All of the EMI-shield-retention features 114, 116,118, 124,126,128,130,134,135, and 136 in the current embodiment are described as restricting movement of the EMI shield in one of three ways: all four directions of the X, Y axes, the +Z direction, or the −Z direction.

FIG. 1B shows movement of the EMI shield restricted in the X, Y axes by three X, Y-retention features. One X, Y-retention feature is a center rib feature 114, located on the middle, left side of the bezel 102, and protruding from the major inner surface 111 of the bezel 102. The center-rib feature 114 comprises a horizontal bar with a rounded top, connected on the left end to the left inner lip 113 of the bezel 102. The EMI shield must be notched to fit around the center-rib feature 114 when the EMI shield is snapped in place against the bezel 102. The other two X,Y-retention features 116,118 are both cross-post features 116,118, protruding from the upper right side and lower right side of the major inner surface 111. Each cross-post feature 116,118 comprises a cross-shaped tip 117,119, extending from a wider cross-post-shoulder section 120,122, serving to partially secure the EMI shield in the −Z direction. The EMI shield is cut to allow the EMI shield to pass through the cross-shaped tips 117,119, and rest on the cross-post shoulders. Note that the inner lip 113 of the bezel 102 may also restrict movement of the EMI shield in the X, Y axes.

FIG. 1B further shows four +Z-retention features restricting movement of the EMI shield in the +Z direction. The first two +Z-retention features are flanged features 124,126 that may also facilitate guiding and fastening the bezel 102 to the equipment enclosure. FIG. 1B shows two flanged features 124,126 attached to the left inner lip 113 of the bezel 102. Each flanged feature 124,126 comprises two guide strips 138,140,142, and 144 extending from the major inner surface 111, to the outer edge of the left inner lip 113. Each guide strip 138,140,142, and 144 comprises a flanged section 146–149 and a tapered section 150–153. The two flanged sections 146–149 extend generally parallel to the major inner surface 111 of the bezel 102 along the outer edge of the left inner lip 113 of the bezel 102. The flanged sections 146–149 extend towards one another before plunging inward, across the inner lip 113, towards the major inner surface 111 of the bezel 102 along the tapered sections 150–153. The tapered sections 150–153 of the guide strips 138,140,142, and 144 extend generally parallel to one another, creating a space along the left inner lip 113 of the bezel 102 between the guide strips 138,140,142, and 144. The space created by the tapered sections 150–153 tapers slightly from the flanged sections 146–149 to the major inner surface 111.

Movement of the EMI shield is further restricted in the +Z direction by two snap-like features 128,130 protruding from the right edge of the major inner surface 111, near the upper and lower corners of the bezel 102. The snap-like features 128,130 are oriented in a vertical fashion, each containing a sloped flange 131,133 extending along the outer edge. The sloped flanges 131,133 face inward, across the major inner surface 111. The underside of the sloped flanges 131,133 provide a surface to lie over the top of the EMI shield when the EMI shield is lying flat against the bezel 102 and snapped in place. The top portion, or sloped portion, of the sloped flanges 131.133 becomes displaced as the right edge of the EMI shield is pressed into position against the bezel 102. The angle of the slope of the sloped flanges 131,133 determines the amount of force required to displace the snap-like features 128,130 during fastening of the EMI shield to the bezel.

FIG. 1B also shows five −Z-retention features, or support features, used to restrict movement of the EMI shield in the −Z direction. Each −Z-retention feature 120,122, and 134–136 protrudes approximately the same distance from the inner surface of the bezel 102, and provides a flat surface allowing the EMI shield to lay flat against the bezel 102. The −Z-retention features 120,122, and 134–136 are offset from the +Z-retention features 124,126,128, and 130 to account for possible variances between the −Z-retention features 120,122, and 134–136, the +Z-retention features 124,126, 128, and 130, and the EMI shield.

The first three −Z-retention features 134–136 protrude along the left side of the major inner surface 111 of the bezel 102. Each of the first three −Z-retention features 134–136 has a T-shape. The remaining two −Z-retention features 120,122 protrude from the upper and lower right side of the major inner surface 111 of the bezel 102, and comprise the wider cross-post shoulder 120,122 of each of the two cross-post X,Y-retention features 116,118. EMI shield movement is also restricted in the −Z direction by the inside edges of the horizontal louvers (103–110 in FIG. 1A).

FIG. 1C is a perspective view of the EMI shield fastened to the inner surface of the bezel by the combination of EMI-shield-retention features. The EMI shield 154 contains five notches 156,158,160,162, and 164 and two cutout holes 166,168 corresponding to the size, shape, and positioning of the X,Y-retention features (114,116, and 118 in FIG. 1B) and the +Z-retention features (124,126,128, and 130 in FIG. 1B). In order to snap the EMI shield 154 in place, the left side of the EMI shield, containing three notches 156,158, and 160, is angled into the left inner lip 113 of the bezel 102. The middle notch 160 fits around the center-rib feature (114 in FIG. 1B), while the upper and lower notches 156,158 fit around the tapered sections (150–153 in FIG. 1B) of each pair of guide strips (138,140,142, and 144 in FIG. 1B), and under the four flanged sections (146–149 in FIG. 1B) of each pair of guide strips (138,140,142, and 144 in FIG. 1B), until the left edge of the EMI shield 154 contacts the left inner lip (113 in FIG. 1B) of the bezel 102.

Once the left edge of the EMI shield 154 is in place, the right edge of the EMI shield 154 rests on the sloped flanges 131,133 of the snap-like features 128,130. As the right edge of the EMI shield 154 is pressed against the bezel 102, the right edge of the EMI shield 154 slides down the sloped flanges 131,133 of the two snap-like features 128,130, causing the snap-like features 128,130 to be pulled back, away from the EMI shield 154. Pulling back the snap-like features 128,130 creates tension within the snap-like features 128,130 as the two, sloped flanges 131,133 are displaced from the original projection of the snap-like features 128,130. Once the EMI shield 154 passes beneath the sloped flanges 131,133, the snap-like features 128,130 return to the original projection, releasing tension in the snap-like features 128,130, thus fastening the EMI shield 154 to the bezel 102.

As the EMI shield 154 slides down the sloped flanges 131,133 of the snap-like features 128,130, the two holes 166,168 in the EMI shield 154 align with the two cross-post features 116,118, allowing the EMI shield 154 to slide over the tips 117,119 of the cross-post features (116,118 in FIG. 1B) until the cross-post shoulders (120,122 in FIG. 1B) contact the EMI shield 154. Consequently, the EMI shield 154 is able to lie flat against the −Z-retention features (120,122, and 134–136 in FIG. 1B) and horizontal louvers (103–110 in FIG. 1A) of the bezel 102 with the sloped flanges 131–133 of the snap-like features 128,130 lying over top of the EMI shield 154, thus snapping the EMI shield 154 in place against the inner surface of the bezel 102.

In the current embodiment of the present invention, when the EMI shield 154 is fully in place, seven features 114,116, 118,124,126,128, and 130 extend through the EMI shield 154. On the left side of the bezel 102, the four, flanged sections 146,148,150, and 152 of the two, flanged features 124,126 lie over the upper and lower edges of two notches 156,158 in the EMI shield 154. In-between the two notches 156,158 on the left side of the bezel 102 is another notch 160 in the EMI shield 154, with the center-rib feature 114 protruding through the notch 160. On the right side of the bezel 102, two holes 166,168 in the EMI shield 154 are shown, each with a cross-post feature 116,118 protruding through the EMI shield 154. Finally, also on the right side of the bezel 102, the two, sloped flanges 131,133 of the snap-like features 128,130 are fastened over the top of the edges of the two notches 162,164 in the EMI shield 154.

Although the present invention has been described in terms of a particular embodiment, it is not intended that the invention be limited to this embodiment. Modifications within the spirit of the invention will be apparent to those skilled in the art. For example, the material used to construct the EMI-shield-retention features may vary. Generally, the EMI-shield-retention features are made from the same material as the bezel. In most cases, plastic can be used. The size and number of EMI-shield-retention features can vary depending on the size and shape of the bezel. Also, the shapes of the individual EMI-shield-retention features may vary. For instance, the −Z-retention features need only provide a flat surface for the EMI shield to lie against. The surfaces of the −Z-retention features not touching the EMI shield may vary according to bezel design or the ease of molding.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A snap-on EMI-shield-retention system comprising:
   an EMI shield having a number of receiving apertures; and
   a bezel including:
      an inner lip and a major inner surface; and
      a number of fastening features molded onto the bezel, the number of fastening features including at least one snap-like feature and at least one flanged feature comprising one or more guide strips, each guide strip having a flanged section, molded onto the inner lip of the bezel, extending parallel to, and proximate to, an outer edge of the inner lip of the bezel, each fastening feature complementary to one of the number of receiving apertures, to which the EMI shield is snap fastened.

2. The snap-on EMI-shield-retention system of claim 1 wherein each snap-like feature is molded onto the opposing edge of the major inner surface of the bezel from each flanged feature.

3. The snap-on EMI-shield-retention system of claim 1 further comprising one or more fastening features projecting through one or more of the receiving apertures in the EMI shield, to further prevent dislocation of the EMI shield.

4. The snap-on EMI-shield-retention system of claim 1 further comprising one or more support features against which the EMI shield rests following snap fastening of the EMI shield to the bezel.

5. A method for attaching an EMI shield to an equipment enclosure, the method comprising:
   molding a number of EMI-shield-retention features onto a bezel having, an inner lip and a major inner surface, the EMI-shield-retention features including at least one snap-like feature and at least one flanged feature, the at least one flanged feature having one or more guide strips molded onto the inner lip of the bezel, each guide strip having a flanged section extending parallel to and proximate to an outer edge of the inner lip of the bezel;
   providing a number of apertures, complementary to the number of EMI-shield-retention features, in the EMI shield; and
   snap fastening the EMI shield to the bezel.

6. The method of claim 5 wherein the snap-like features are molded onto the opposing edge of the major inner surface of the bezel from the flanged features.

7. The method of claim 5 one or more of the EMI-shield-retention features project through one or more of the receiving apertures in the EMI shield, to further prevent dislocation of the EMI shield.

8. The method of claim 5 further including providing one or more support features against which the EMI shield rests following snap fastening of the EMI shield to the bezel.

* * * * *

UNITED STATES PATENT AND TRADEMARK OFFICE
CERTIFICATE OF CORRECTION

PATENT NO. : 6,590,784 B2
DATED : July 8, 2003
INVENTOR(S) : Michael Leslie Wortman et al.

It is certified that error appears in the above-identified patent and that said Letters Patent is hereby corrected as shown below:

Column 1,
Line 43, after "semi-permanently" delete ")"
Line 47, after "expensive" delete "." and insert therefor -- , --

Column 2,
Line 6, delete "-Z and -Z." and insert therefor -- +Z and -Z. --

Column 6,
Line 18, after "having" delete ","
Line 33, after "claim 5" insert -- wherein --

Signed and Sealed this

Twenty-sixth Day of April, 2005

JON W. DUDAS
*Director of the United States Patent and Trademark Office*